(12) United States Patent
Nagai et al.

(10) Patent No.: US 11,542,629 B2
(45) Date of Patent: Jan. 3, 2023

(54) METHOD OF PLATING, APPARATUS FOR PLATING, AND NON-VOLATILE STORAGE MEDIUM THAT STORES PROGRAM

(71) Applicant: EBARA CORPORATION, Tokyo (JP)

(72) Inventors: Mizuki Nagai, Tokyo (JP); Naoto Takahashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 43 days.

(21) Appl. No.: 17/605,191

(22) PCT Filed: May 25, 2020

(86) PCT No.: PCT/JP2020/020492
§ 371 (c)(1),
(2) Date: Oct. 20, 2021

(87) PCT Pub. No.: WO2020/250650
PCT Pub. Date: Dec. 17, 2020

(65) Prior Publication Data
US 2022/0186398 A1 Jun. 16, 2022

(30) Foreign Application Priority Data
Jun. 14, 2019 (JP) .............................. JP2019-111339

(51) Int. Cl.
*C25D 21/12* (2006.01)
*C25D 7/12* (2006.01)
(Continued)

(52) U.S. Cl.
CPC .............. *C25D 21/12* (2013.01); *C25D 5/022* (2013.01); *C25D 7/123* (2013.01); *C25D 17/001* (2013.01); *C25D 21/10* (2013.01)

(58) Field of Classification Search
CPC .............. C25D 7/12–123; C25D 5/022; H01L 21/2885; H01L 21/76873
See application file for complete search history.

(56) References Cited

U.S. PATENT DOCUMENTS

2016/0097141 A1 4/2016 Yasuda et al.
2020/0199770 A1* 6/2020 Moriyama ........... C25D 17/008

FOREIGN PATENT DOCUMENTS

JP S57-207192 A 12/1982
JP S64-075697 A 3/1989
(Continued)

OTHER PUBLICATIONS

International Patent Application No. PCT/JP2020/020492; Int'l Search Report; dated Jul. 28, 2020; 2 pages.

*Primary Examiner* — Ho-Sung Chung
(74) *Attorney, Agent, or Firm* — BakerHostetler

(57) ABSTRACT

There is provided a method of plating, comprising: a process of providing a substrate that includes a first face and a second face having different patterns; a plating process of respectively supplying electric current of a first plating current density and electric current of a second plating current density to the first face and to the second face of the substrate, so as to form a plating film on the first face and a plating film on the second face; and a process of, after plating is completed first either on the first face or on the second face, supplying protection current to the face where plating is completed first, wherein the protection current has a smaller current density than the first plating current density or the second plating current density of the electric current supplied to the face where plating is completed first during plating.

14 Claims, 8 Drawing Sheets

(51) Int. Cl.
*C25D 5/02* (2006.01)
*C25D 17/00* (2006.01)
*C25D 21/10* (2006.01)

(56) References Cited

FOREIGN PATENT DOCUMENTS

| | | | |
|---|---|---|---|
| JP | 2005-097721 A | 4/2005 | |
| JP | 2011-089157 A | 5/2011 | |
| JP | 2016-074975 A | 5/2016 | |
| JP | 2019-007075 A | 1/2019 | |
| JP | 2019007075 A | * 1/2019 | ........... C25D 17/001 |

* cited by examiner

Fig. 5A
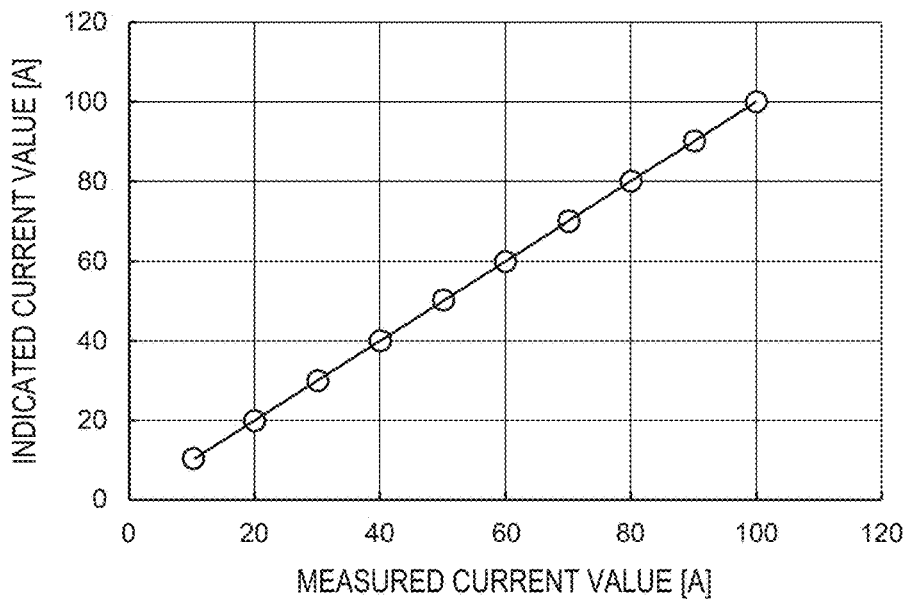
Fig. 5B
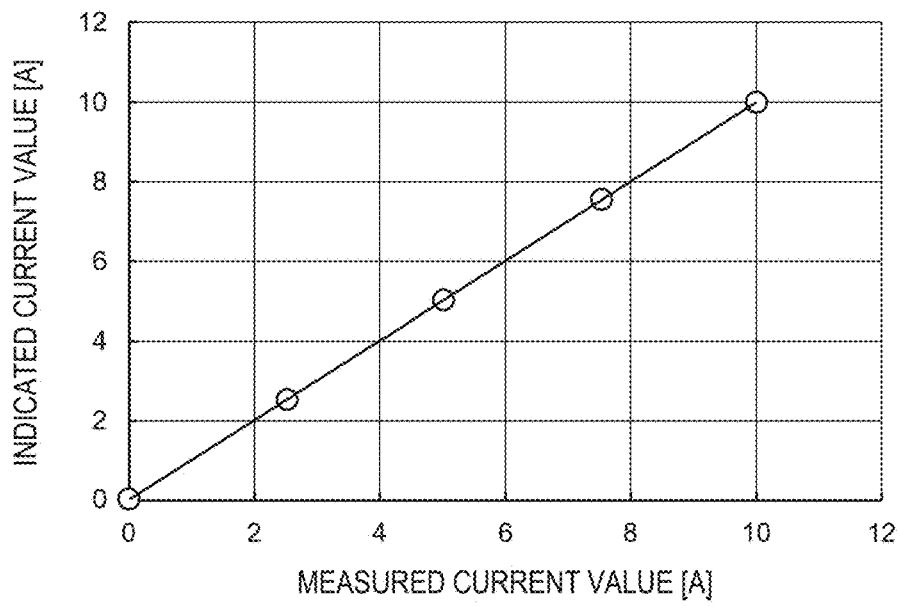
Fig. 6
|  | CURRENT RANGE | FACTOR a | FACTOR b |
|---|---|---|---|
| FILM FORMING CURRENT | 10~100A | 0.9998 | -0.0345 |
| PROTECTION CURRENT | 0~10A | 0.9971 | -0.0105 |

| POWER SUPPLY DEVICE | USE RANGE | FACTOR a | FACTOR b |
|---|---|---|---|
| POWER SUPPLY DEVICE 71 | FILM FORMING CURRENT | a11 | b11 |
| | PROTECTION CURRENT | a12 | b12 |
| POWER SUPPLY DEVICE 72 | FILM FORMING CURRENT | a21 | b21 |
| | PROTECTION CURRENT | a22 | b22 |
| POWER SUPPLY DEVICE 73 | FILM FORMING CURRENT | a31 | b31 |
| | PROTECTION CURRENT | a32 | b32 |
| POWER SUPPLY DEVICE 74 | FILM FORMING CURRENT | a41 | b41 |
| | PROTECTION CURRENT | a42 | b42 |

METHOD OF PLATING, APPARATUS FOR PLATING, AND NON-VOLATILE STORAGE MEDIUM THAT STORES PROGRAM

TECHNICAL FIELD

The present disclosure relates to a method of plating, an apparatus for plating, and a non-volatile storage medium that stores a program.

BACKGROUND ART

Conventionally, wiring is formed in fine wiring grooves, holes or resist openings provided on the surface of a semiconductor wafer and bumps (bump electrodes) are formed on the surface of a semiconductor wafer or the like to be electrically connected with electrodes of a package or the like. For example, an electroplating method, a vapor deposition method, a printing method, a ball bump method, and the like have been known as the method of forming such wiring and bumps. The electroplating method that allows for miniaturization and that has relatively stable performance has widely been employed, accompanied with the recent trend of an increase in the I/O number of semiconductor chips and a reduction in the pitch size.

A known configuration of an electroplating apparatus aims to perform double-sided plating as described in Japanese Unexamined Patent Publication No. 2019-007075 (Patent Document 1). This plating apparatus is configured to supply different amounts of electric current from a first external connecting portion and a second external connecting portion of a substrate holder to respective faces of a substrate and thereby plate the respective faces of the substrate. Japanese Unexamined Patent Publication No. 2016-74975 (Patent Document 2) describes a configuration of applying a second voltage in a forward direction between an anode and a substrate prior to plating or after completion of plating, so as to prevent the flow of electric current in a reverse direction to the direction of electric current supplied during plating and thereby prevent dissolution of a copper plating film.

CITATION LIST

Patent Document

Patent Document 1: Japanese Unexamined Patent Publication No. 2019-007075
Patent Document 2: Japanese Unexamined Patent Publication No. 2016-74975

SUMMARY OF INVENTION

Technical Problem

The plating apparatus of Patent Document 1 has a problem that a plating film on one face of the substrate where plating is completed first is exposed to a plating solution and is corroded for a time period after plating is completed on one face and before plating is completed on the other face and the substrate is pulled out. The plating apparatus of Patent Document 2 does not cover double-sided plating. Additionally, even when the flow of electric current in the reverse direction is prevented by providing a diode, there is still a possibility that the surface of the plating film is corroded to increase the surface roughness, since the copper plating solution is a strong acid.

An object of the present disclosure is to solve at least part of the problems described above.

Solution to Problem

According to one aspect, there is provided a method of plating, comprising: a process of providing a substrate that includes a first face and a second face having different patterns; a plating process of respectively supplying electric current of a first plating current density and electric current of a second plating current density to the first face and to the second face of the substrate, so as to form a plating film on the first face and a plating film on the second face; and a process of, after plating is completed first either on the first face or on the second face, supplying protection current to the face where plating is completed first, wherein the protection current has a smaller current density than the first plating current density or the second plating current density of the electric current supplied to the face where plating is completed first during plating.

BRIEF DESCRIPTION OF DRAWINGS

FIG. 5A is a graph showing a measurement example of the measured current value (actual current value) against the indicated current value in a current use range of film forming current;

FIG. 5B is a graph showing a measurement example of the measured current value (actual current value) against the indicated current value in a current use range of protection current:

FIG. 6 is a chart showing an example of set values of current correction factors with regard to respective current ranges;

DESCRIPTION OF EMBODIMENTS

Figure 1:
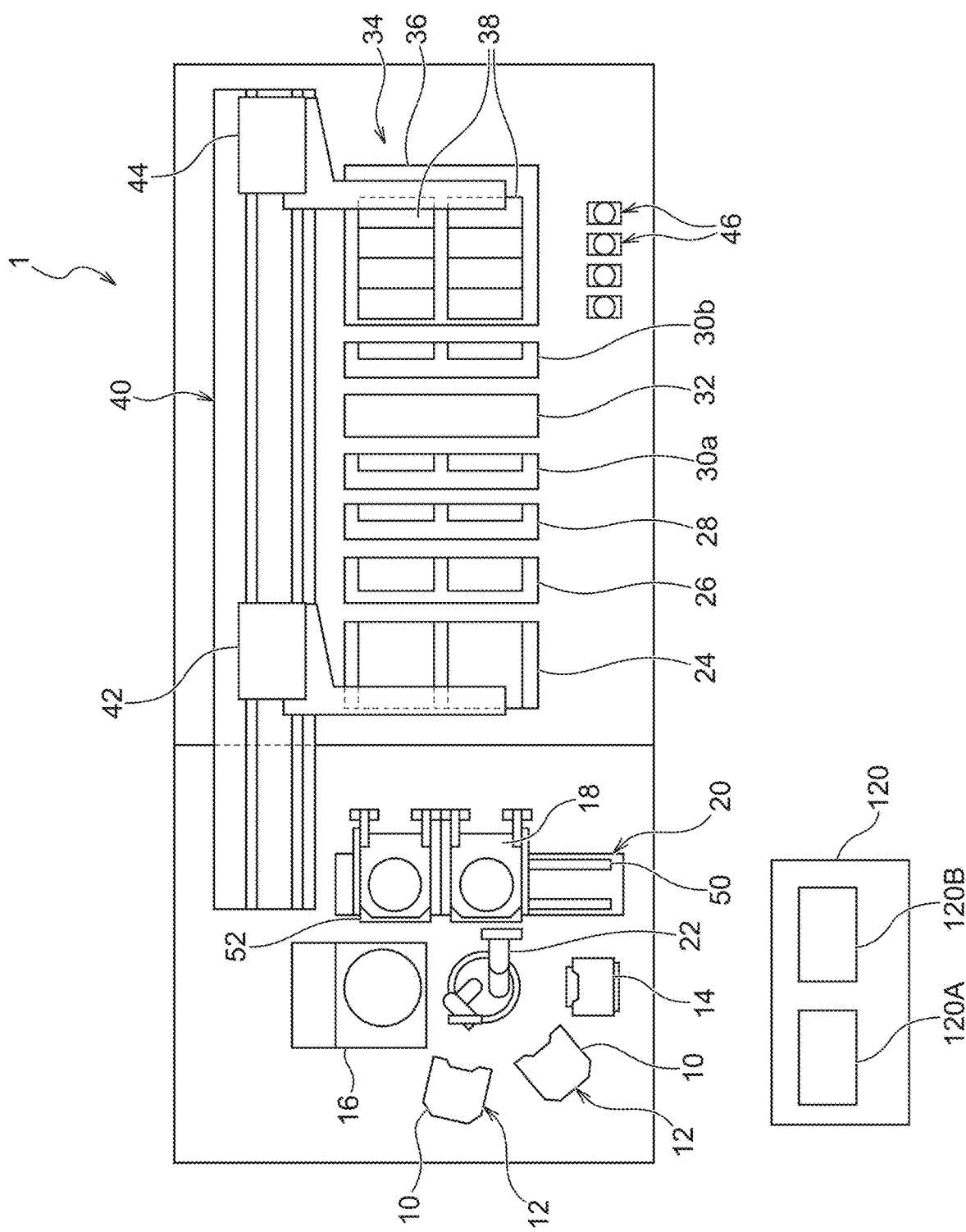
FIG. 1 is a general layout drawing illustrating a plating apparatus according to one embodiment.

The following describes embodiments in more detail with reference to drawings.

In the drawings described below, identical or equivalent components are expressed by identical reference signs, and duplicated description is omitted.

First Embodiment

FIG. 1 is a general layout drawing illustrating a plating apparatus according to one embodiment. With referring to FIG. 1, a plating apparatus 1 includes two cassette tables 12 configured such that cassettes 10 respectively having substrates, such as semiconductor wafers, placed therein are mounted on the cassette tables 12; an aligner 14 configured to adjust the position of an OF (orientation flat), a notch or the like of a substrate to a predetermined direction; a substrate loading/unloading station 20 configured to load and unload substrates onto and from substrate holders 18 placed thereon; and a spin dryer 16 configured to rotate a substrate after a plating process at a high speed so as to dry the substrate. A substrate transfer device 22, for example, a transfer robot, configured to transfer the substrate between these units is placed at the approximate center of these units. The substrate may be any substrate, for example, a semiconductor wafer, a printed circuit board, a liquid crystal board, or a MEMS. The substrate may be in a circular shape, an angular (polygonal) shape or any other arbitrary shape. A pattern (concavity and convexity) is formed on a surface of the substrate. The "pattern" herein means via holes or trenches provided to form wiring, a resist pattern provided to form bumps, rewiring, or electrode pads, an insulating film pattern or the like.

The substrate loading/unloading station 20 includes amounting plate 52 in a flat plate-like shape configured to be slidable in a horizontal direction along rails 50. In such a state that two substrate holders 18 are mounted horizontally in parallel to each other on the mounting plate 52, the substrate transfer device 22 transfers a substrate to and from one substrate holder 18. The substrate transfer device 22 subsequently slides the mounting plate 52 in the horizontal direction and transfers a substrate to and from the other substrate holder 18.

A stocker 24 configured to store and temporarily place the substrate holder 18 therein, a pre-wet module 26 configured to soak a substrate in pure water, a pre-soak module 28 configured to remove an oxide film on the surface of a seed layer formed on the surface of the substrate by etching, a first rinse module 30a configured to wash the surface of the substrate with pure water or the like, a blow module 32 configured to drain the substrate after washing, a second rinse module 30b configured to wash the surface of the substrate with pure water or the like, and a plating module 34 are placed in the plating apparatus 1. The layout of the respective units is not limited to the illustrated layout, but another configuration and another layout may be employed.

The plating module 34 includes an overflow tank 36 and a plurality of plating baths 38 placed inside thereof. Each of the plating baths 38 causes the substrate holder 18 that holds a substrate and that is placed inside of the plating bath 38 to be subjected to a plating process, for example, copper plating. The following describes copper plating according to this embodiment. The plating apparatus 1 is, however, similarly used for plating of nickel, solder, silver, gold and the like. Paddle driving devices 46 are placed on the side of the overflow tank 36 to drive paddles 61 (shown in FIG. 2) that are located inside of the respective plating baths 38 to stir a plating solution.

The plating apparatus 1 is provided with a substrate holder transfer device 40 configured to transfer the substrate holder 18 with a substrate W. The substrate holder transfer device 40 is, for example, a linear motor type and is placed on the side of the substrate loading/unloading station 20 and the respective modules described above. The substrate holder transfer device 40 includes a first transporter 42 and a second transporter 44. The first transporter 42 is configured to transfer the substrate between the substrate loading/unloading station 20 and the stocker 24. The second transporter 44 is configured to transfer the substrate between the stocker 24, the pre-wet module 26, the pre-soak module 28, the rinse modules 30a and 30b, the blow module 32 and the plating module 34. The transfer paths described above are only illustrative, and each of the first transporter 42 and the second transporter 44 may employ other transfer paths. One modification of the substrate holder transfer device 40 may include only the first transporter 42 with omission of the second transporter 44.

A controller 120 is configured to control the operations of the respective components of the plating apparatus described above and thereby control substrate processing operations. The controller 120 includes a memory 120A configured to store various set data and various programs therein and a CPU 120b configured to perform the programs stored in the memory. A storage medium that configures the memory may include a volatile storage medium and/or a non-volatile storage medium. The storage medium may include one or a plurality of any storage mediums, for example, a ROM, a RAM, a flash memory, a hard disk, a CD-ROM, a DVD-ROM, and a flexible disk. The programs stored in the memory include, for example, a program of controlling a plating process of the substrate and a program of controlling transfer control of the substrate and the substrate holder. The controller 120 is configured to make communication with a non-illustrated upper level controller that comprehensively controls the plating apparatus and other relevant apparatuses and to exchange data with a database included in the upper level controller. The controller 120 and/or another controller or a plurality of other controllers may work in cooperation or alone to control the operations of the respective components of the plating apparatus. In the controller 120, a controller 39 (described later) and/or another controller or the plurality of other controllers, at least part of the functions implemented by the programs may be configured by hardware, such as a sequencer and/or an ASIC.

Figure 2:
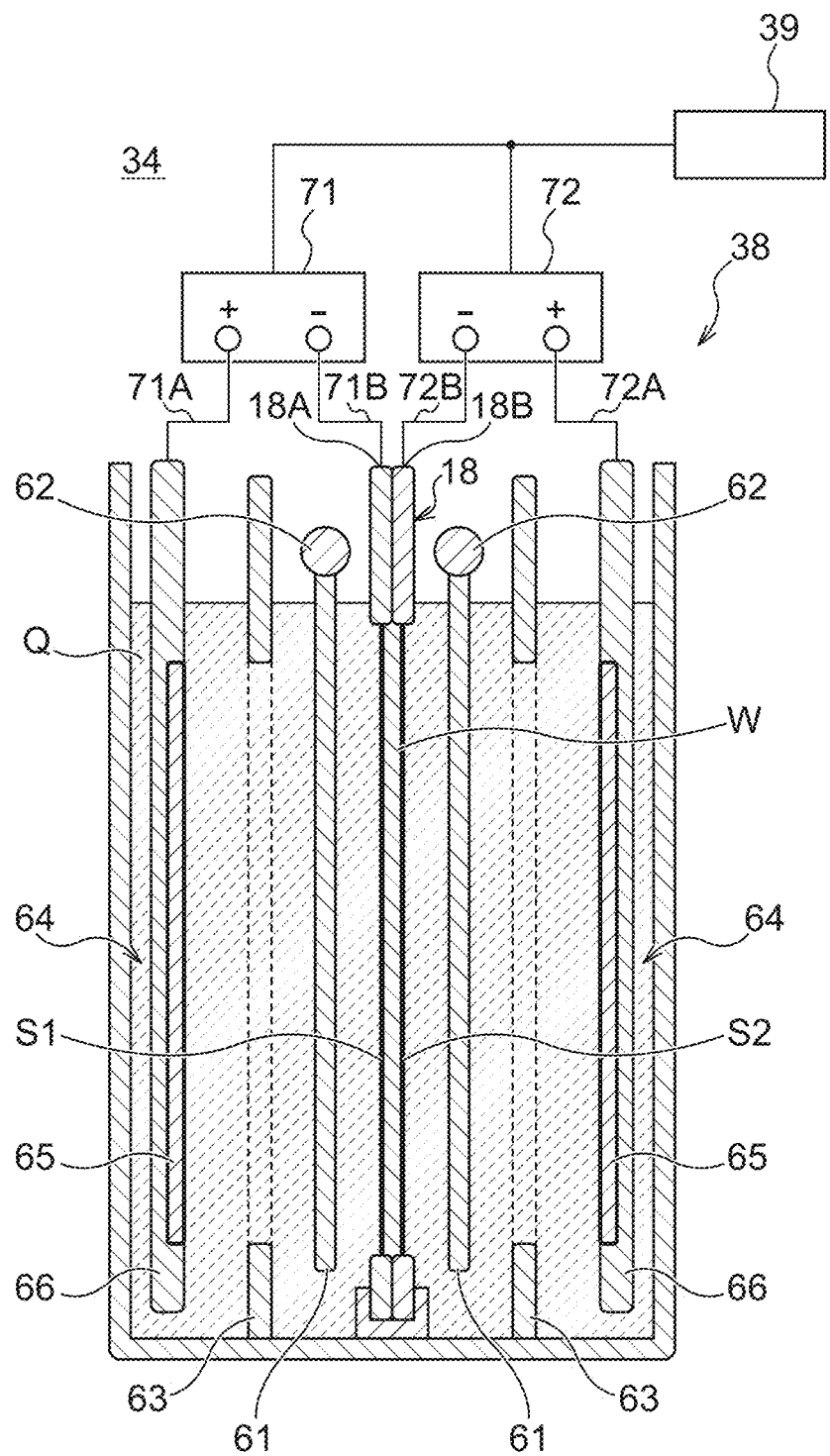
FIG. 2 is a schematic diagram illustrating a plating module viewed from the side.

FIG. 2 is a schematic diagram illustrating the plating module viewed from the side. In this drawing, for convenience of explanation, part of one plating bath 38 in the plating module 34 is illustrated representatively, with omission of the overflow module 36. The substrate holder 18 holding the substrate W is carried into the plating bath 38 and is soaked in a plating solution Q. The substrate holder 18 herein is a substrate holder for double-sided plating provided with openings to expose respective faces S1 and S2 of the substrate W and used to plate the respective faces S1 and S2 of the substrate W. A resist pattern is formed on each of the faces S1 and S2 of the substrate W and has an opening at a position where a plating film is to be formed. In some of the description below, for convenience of explanation, the face S1 of the substrate W is referred to as the front surface, and the face S2 is referred to as the rear face. Either of the face S1 and the face S2 may be the front surface, and either of the face S2 and the face S1 may be the rear face. The substrate holder 18 includes an external connection terminal 18A electrically connected with a contact that comes into contact with a seed layer (plating base) of the face S1 of the substrate W, and an external connection terminal 18B electrically connected with a contact that comes into contact with a seed layer of the face S2 of the substrate W. According to the embodiment, the plating solution Q is a chemical solution for copper plating and is, for example, a copper sulfate solution. In another example, the plating solution Q may be a chemical solution for another metal plating.

In the plating module 34, paddles 61, regulation plates 63 and anodes 65 are placed at positions on respective sides of the substrate holder 18. The paddle 61 is mounted to a paddle shaft 62 and is located in the vicinity of the substrate W held by the substrate holder 18. The paddle shafts 62 are reciprocated by the paddle driving devices 46 to reciprocate the paddles 61 parallel to the faces of the substrate W and stir the plating solution Q. Stirring the plating solution Q with the paddles 61 enables a sufficient amount of copper ion to be uniformly supplied to the faces of the substrate W. The anode 65 is held and placed by an anode holder 66. A configuration including the anode 65 and the anode holder may be referred to as an anode unit 64. The regulation plate 63 is one example of an electric field regulation plate and is placed between the paddle 61 and the anode 65 to regulate the electric field/the flow of electric current between the substrate W and the anode 65.

A rectifier 71 is connected with the anode unit 64 and the substrate holder 18 on the face S1-side. The rectifier 71 is a device (power supply device) including a rectifier circuit or a power supply circuit for converting AC current into DC current and is configured to output DC current corresponding to a set current value. The external connection terminal 18A of the substrate holder 18 is connected with a negative electrode (lower potential side) of the rectifier 71 via wiring 71B. On the face S1-side, the anode 65 is electrically connected with wiring 71A from a positive electrode (higher potential side) of the rectifier 71 via wiring or the like placed in the anode holder 66. On the face S1-side, the rectifier 71 forms an electric current loop passing through the anode 65, the plating solution Q, and the face S1 of the substrate W. The rectifier 71 is enabled to supply plating current (film forming current) and/or protection current (described later) passing through the anode 65, the plating solution Q, and the face S1 of the substrate W.

A rectifier 72 is connected with the anode unit 64 and the substrate holder 18 on the face S2-side. The rectifier 72 is a device (power supply device) including a rectifier circuit or a power supply circuit for converting AC current into DC current and is configured to output DC current corresponding to a set current value. The external connection terminal 18B of the substrate holder 18 is connected with a negative electrode (lower potential side) of the rectifier 72 via wiring 72B. On the face S2-side, the anode 65 is electrically connected with wiring 72A from a higher potential side of the rectifier 72 via wiring or the like placed in the anode holder 66. On the face S2-side, the rectifier 72 forms an electric current loop passing through the anode 65, the plating solution Q, and the face S2 of the substrate W. The rectifier 72 is enabled to supply plating current (film forming current) and protection current (described later) passing through the anode 65, the plating solution Q, and the face S2 of the substrate W.

The rectifiers 71 and 72 are controlled by a controller 39. The controller 39 may control the rectifiers 71 and 72, in response to instructions from the controller 120 and/or in cooperation with the controller 120.

In the case where the direction of a face where plating is completed first is known in the plating module 34, the rectifier 71 or 72 connected with the face where plating is completed first is required to have the function of supplying the protection current. The rectifiers 71 and 72 may be configured as individual devices or may be configured as a single device. In another example, the rectifier 71 or 72 may be replaced by a device (power supply device) that includes a power circuit for converting a DC voltage into a DC voltage in a predetermined voltage range and that is configured to output DC current corresponding to a set current value.

(Protection Current)

When the face S1 and the face S2 of the substrate W have different patterns (different shapes or different depths), the plating completion time may differ between the face S1 and the face S2. For example, when the face S1 and the face S2 have different patterns, the respective faces have different target plating film thicknesses. Furthermore, it is preferable to plate the respective faces with different plating currents (different densities) for different plating times. In this case, the face where plating has been completed first (for example, the face S1) is held to wait in the plating solution in the state that the supply of plating current (film forming current) to this face is at stop, until plating is completed on the other face (for example, the face S2) and the substrate W is pulled out from the plating solution. During this waiting time period, the surface of a plating film on the face S1 may be corroded by the plating solution having strong acidity (the copper sulfate solution or the like). This is likely to increase the surface roughness of the plating film. With a view to preventing such corrosion, on the other hand, an employable method may select the plating current (density) and the plating time to complete plating on the respective faces simultaneously. This method is, however, unlikely to provide optimum processing conditions for plating on the respective faces. The embodiment accordingly performs control that supplies weak protection current (Ip shown in FIG. 8) in an identical direction with that of the film forming current during plating, to the face where plating is completed first, after completion of the plating, for the purpose of protecting the plating film. This protection current suppresses the metal from additionally depositing on the plating film and also suppresses the metal in the plating film from being dissolved into the plating solution.

Configuration Example of Protection Current Density

The protection current Ip has such a current value as to suppress corrosion of the plating film on the face S1/S2 where plating is completed first and to suppress further deposition of the metal on the face S1/S2 (additional plating), during the waiting time period from the time of completion of plating the face S1/S2 where plating is completed first (from the time when the supply of film forming current is stopped) to the time when the substrate is pulled out. In one example, the protection current Ip is an electric current that has an identical direction with that of an electric current I1 supplied during plating (during film formation) on the face S1/S2 and that has the magnitude of approximately 1/100 or not higher than 1/100 of the electric current I1.

The surface roughness of the plating film on the face S1 of the substrate W held to wait in the plating solution after the stop of the film forming current is affected by the value of an opening ratio of this face S1 (a ratio of an area where the plating film is formed to an exposed surface area exposed on the substrate holder). It is accordingly necessary to determine the magnitude of the protection current according to the value of the opening ratio. The following describes an example of a method of determining the magnitude of the protection current according to the value of the opening ratio with reference to FIG. 3 and FIG. 4.

Figure 3:
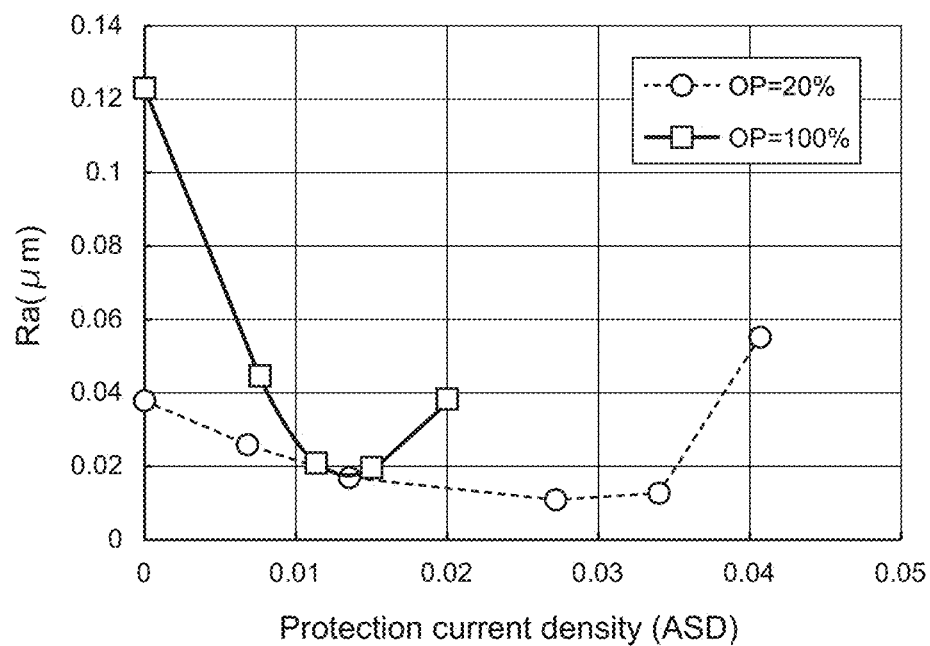
FIG. 3 is a graph showing the results of an experiment measuring a relationship between the magnitude of protection current and the surface roughness with respect to substrates having different opening ratios.
Figure 4:
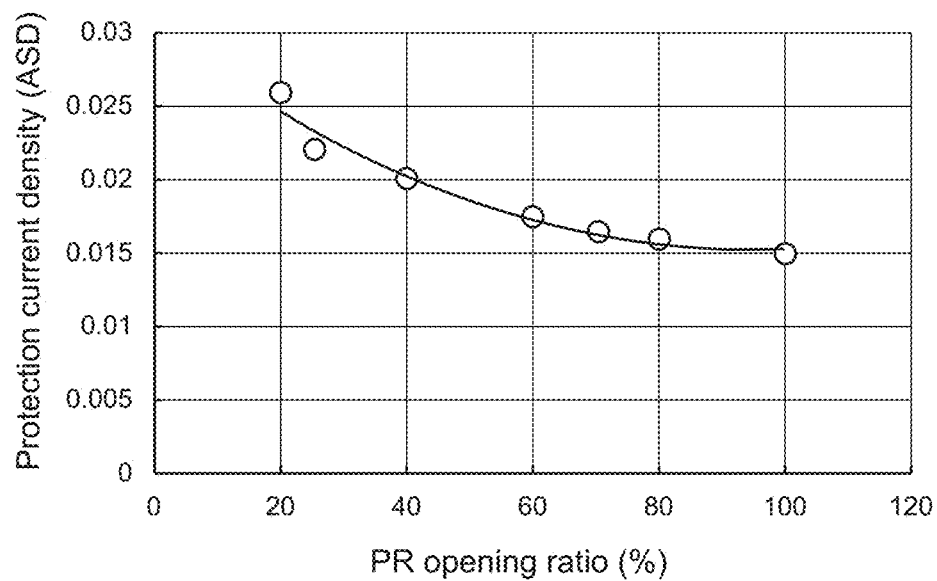
FIG. 4 is a graph showing a relationship between the opening ratio and the magnitude of protection current to minimize the surface roughness.

FIG. 3 is a graph showing the results of an experiment measuring a relationship between the magnitude of the protection current and the surface roughness with respect to substrates having different opening ratios. In this example, each substrate with a plating film formed thereon was soaked in a plating solution under the supply of protection current for a predetermined time period and was then pulled out, and a surface roughness Ra of the plating film (arithmetic mean roughness) was measured. FIG. 4 is a graph showing a relationship between the opening ratio and the magnitude of the protection current to minimize the surface roughness.

FIG. 3 shows the protection current density (magnitude of the protection current) as abscissa and the surface roughness Ra as ordinate. Measurement points shown by circles and a curve shown by a broken line are the results of measurement with respect to a face where a plating film was formed at an opening ratio OP=20%. Measurement points shown by squares and a curve shown by a solid line are the result of measurement with respect to a face where a plating film was formed at an opening ratio OP=100%. According to FIG. 3, a protection current density of approximately 0.0255 A/dm$^2$ has the minimum surface roughness Ra with regard to the plating film formed at OP=20%, and a protection current density of approximately 0.015 A/dm$^2$ has the minimum surface roughness Ra with regard to the plating film formed at OP=100%. With regard to other values of the opening ratio OP, the surface roughness is similarly measured and the protection current density is determined to minimize the surface roughness.

FIG. 4 shows the values of the protection current density to minimize the surface roughness Ra of the plating film with regard to the respective opening ratios OP, based on these measurement results. As understood from this graph, in order to minimize the surface roughness Ra, the protection current density needs to increase with a decrease in the opening ratio OP, while needing to decrease with an increase in the opening ratio OP. A relational expression or a data table showing the relationship between the opening ratio and the value of the protection current density to minimize the surface roughness Ra, like a curve shown in FIG. 4 is determined in advance by experiment and is stored in a memory or the like. This enables the magnitude of the protection current to be set according to a plurality of different substrate specifications. The magnitude of the protection current is not necessarily determined to minimize the surface roughness Ra but may be determined to give the surface roughness Ra in an allowable range.

More specifically, a relational expression or a table showing the relationship between the opening ratio and the value of the protection current density to minimize the surface roughness Ra is stored in a memory or the like of the controller 39 and/or of the controller 120. The protection current density is determined according to the relational expression or the table described above, based on an opening ratio OP set in a recipe or the like or based on an opening ratio OP by substrate information or image recognition in a pattern configuration received from an upper level communication or a user interface. This configuration enables the magnitude of the protection current to be automatically set corresponding to the protection current density.

(Current Control)

Each rectifier is known to have an intrinsic mechanical error. The controller 39 and/or the controller 120 correct a set current value that is to be output to the rectifier by using a relational expression shown by Expression (1) and outputs a corrected set current value as an indicated current value to the rectifier:

$$\text{(indicated current value)} = a \times \text{(set current value)} + b \quad (1)$$

where a and b denote current correction factors.

In the case where the film forming current (during plating) and the protection current (after plating) are output from a common rectifier, it may be difficult to ensure the accuracy in the outputs from the identical rectifier, since the film forming current and the protection current have significantly different set current values. This is likely to cause a variation in thickness of the plating film in the course of film forming and/or an insufficiency of the protection current (the occurrence of corrosion) or an excess of the protection current (an abnormality in the thickness of the plating film or reduction of the uniformity caused by additional plating) in the course of protection from corrosion by the plating solution. It is accordingly preferable to separately set the current correction factors a and b with respect to a current use range of the film forming current (FIG. 5A) and a current use range of the protection current (shown in FIG. 5B).

FIG. 5A is a graph showing a measurement example of the measured current value (actual current value) against the indicated current value in the current use range of the film forming current. FIG. 5B is a graph showing a measurement example of the measured current value (actual current value) against the indicated current value in the current use range of the protection current. FIG. 6 is a chart showing an example of set values of the current correction factors with regard to respective current ranges. A relationship between the measured current value (actual current value) and the indicated current value is determined from the results of the measurements shown in FIG. 5A and FIG. 5B. The set current values are determined corresponding to desired measured current values. A relationship between the set current value and the indicated current value is calculated by substituting the measured current value with the set current value in the results of the measurements shown in FIG. 5A and FIG. 5B. This allows for calculation of the correction factors a and b in Expression (1). The correction factors a and b are calculated as shown in FIG. 6 from the results of the measurements shown in FIG. 5A and FIG. 5B. Expression (1) is rewritten as follows by using the calculated correction factors:

<Use Range Of Film Forming Current>

$$\text{(indicated current value)} = 0.9998 \times \text{(set current value)} - 0.0345 \quad (2)$$

<Use Range Of Protection Current>

$$\text{(indicated current value)} = 0.9971 \times \text{(set current value)} - 0.0105 \quad (3)$$

The controller 39 or the controller 120 accordingly corrects a set current value set in a recipe or the like to an indicated current value by Expression (2) or Expression (3) given above and outputs the indicated current value to the rectifier. An actual current value corresponding to the desired set current value is then output from the rectifier.

Figures 7, 8:
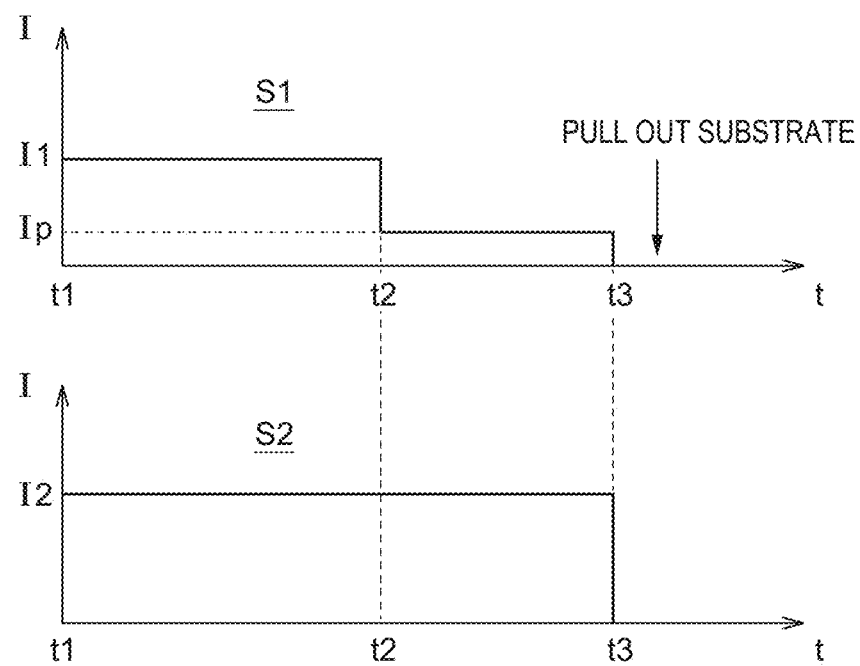
FIG. 7 illustrates an example of a database configuration of the current correction factors.
FIG. 8 is a time chart of a protection current supply process.

FIG. 7 illustrates an example of a database configuration of the current correction factors. The current correction factors a and b are determined in advance for each rectifier by experiment with regard to the respective current use ranges of the film forming current and the protection current as shown in FIG. 7, and the above relational expressions are stored in the memory or the like of the controller 39 and/or the controller 120. The controller 120 and/or the controller 39 use the relational expression (Expression (2) or Expression (3)) according to the rectifier and the current use range to correct a set current value to an indicated current value and outputs the indicated current value to the corresponding rectifier. In the case where a common rectifier is used to output the film forming current and the protection current, this configuration enables an appropriate indicated current value to be output according to the current use range and controls the actual current value with high accuracy.

(Control Flow)

Figure 9:
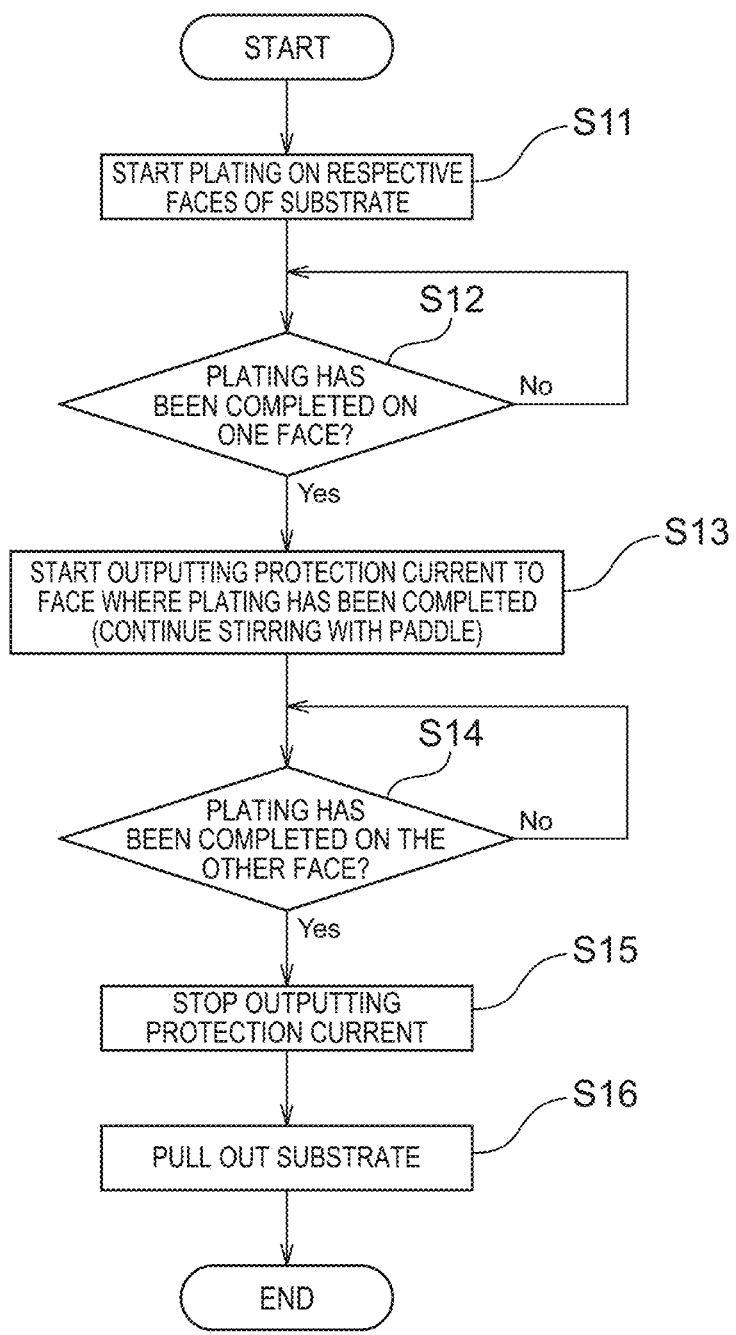
FIG. 9 is a flowchart showing the protection current supply process.

FIG. 8 is a time chart of a protection current supply process. FIG. 9 is a flowchart showing the protection current supply process. This process is performed by the controller 39 and/or the controller 120. The controller 39, the controller 120 and/or another controller or a plurality of other controllers may perform this process in cooperation or alone. In FIG. 8, an upper graph shows the electric current supplied to the face S1, and a lower graph shows the electric current supplied to the face S2. Each graph has the time as abscissa and the electric current as ordinate.

At step S11, the controller 39 and/or the controller 120 start plating on the respective faces S1 and S2 of the substrate W soaked in the plating solution of the plating module 34 (at a time t1 in FIG. 8). At this moment, the controller 39 and/or the controller 120 use the current correction factors a and b set in advance (Expression (2), shown in FIG. 7) to output the indicated current values obtained by correcting the set current values to the respective power supply devices 71 and 72. Film forming currents I1 and I2 are then output from the respective power supply devices 71 and 72. In FIG. 8, for convenience of explanation, the film forming currents I1 and I2 are shown as fixed values. In the actual state, however, the film forming current may be varied with time according to the setting of a recipe.

At step S12, the controller 39 and/or the controller 120 determine whether plating has been completed on one face (on the face S1 in this example). When plating has not yet been completed on either of the faces, plating is continued for the respective faces S1 and S2. When it is determined that plating has been completed on one face S1 (at a time t2 in FIG. 8), the process proceeds to step S13. Completion of plating is determined, for example, based on elapse of the plating time set in the recipe.

At step S13, the controller 39 and/or the controller 120 start outputting a protection current Ip set as described above from the rectifier 71 to the face S1 where plating has been completed (in the upper graph of FIG. 8, at the time t2). At this moment, the controller 39 and/or the controller 120 determine a protection current density by using the opening ratio OP obtained from upper level communication or set in the recipe and the relational expression of the opening ratio and the protection current or the table of the opening ratio and the protection current (shown in FIG. 4), determine a protection current value Ip corresponding to the determined protection current density, calculate an indicated current value from this protection current value Ip as the set current value by using the current correction factors a and b described above (Expression (3), shown in FIG. 7), and output the indicated current value to the corresponding rectifier 71. With a view to obtaining a sufficiently smooth face, stirring the plating solution Q is continued by using the paddle 61 on the face S1-side even in the course of outputting the protection current after completion of plating. In the case where plating is completed first on the face S2, protection current is similarly output from the rectifier 72 to the face S2. A protection current value on the face S2-side is obtained in a similar manner to that of the protection current value on the face S1-side. It is determinable whether plating is completed first on the face S1 or on the face S2, based on the data in the recipe.

At step S14, the controller 39 and/or the controller 120 determine whether plating has been completed on the other face (on the face S2 in this example) where plating is completed later. When plating has not yet been completed on the face S2, the controller 39 and/or the controller 120 continue outputting the protection current to the face S1 and stirring with the paddle on the face S1-side. In the case where the other face where plating is completed later is the face S1, the controller 39 and/or the controller 120 determine whether plating has been completed on the face S1. When plating has not yet been completed on the face S1, the controller 39 and/or the controller 120 continue outputting the protection current to the face S2 and stirring with the paddle on the face S2-side. When it is determined that plating has been completed on the other face where plating is completed later (at a time t3 in FIG. 8), on the other hand, the process proceeds to step S15.

At step S15, the controller 39 and/or the controller 120 stop outputting the protection current to the face S1 where plating has been completed first (at a time t3 in the upper graph of FIG. 8) and stop stirring with the paddle on the face S1-side. In the case where the face where plating has been completed first is the face S2, the controller 39 and/or the controller 120 stop outputting the protection current to the face S2 and stop stirring with the paddle on the face S2-side. The substrate W is then pulled out from the plating module 34.

Examples

Figure 10A:
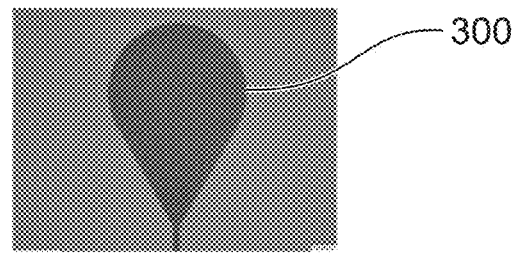
FIG. 10A is a taken image of the surface conditions of a plating film after a substrate was soaked in a plating solution (in the case of no protection current)
Figure 10B:
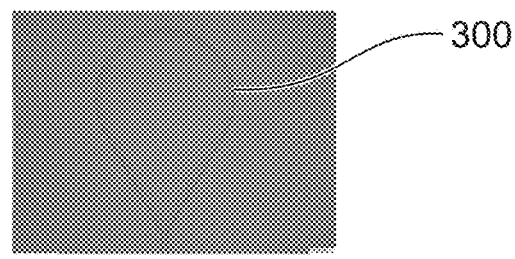
FIG. 10B is a taken image of the surface conditions of the plating film after the substrate was soaked in the plating solution (in the case of an optimum protection current density.
Figure 10C:
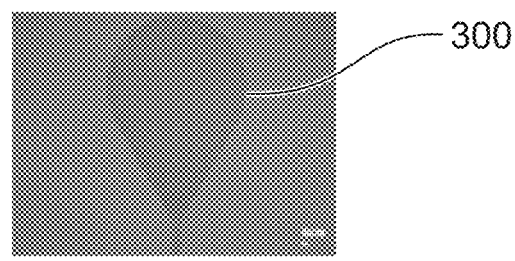
FIG. 10C is a taken image of the surface conditions of the plating film after the substrate was soaked in the plating solution (in the case of insufficient protection current)
Figure 10D:
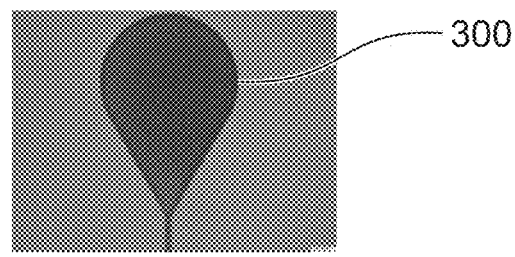
FIG. 10D is a taken image of the surface conditions of the plating film after the substrate was soaked in the plating solution (in the case of excess protection current)

FIG. 10A to FIG. 10D are taken images of the surface conditions of a plating film after a substrate having a resist pattern was subjected to copper plating of 5 μm with a film forming current of 5 ASD and was then soaked in a plating solution for one hour. FIG. 10A is an image taken when no protection current was supplied during soaking in the plating solution. This taken image shows that a plating film 300 is corroded. FIG. 10B is an image taken when protection current of an appropriate current density was supplied during soaking in the plating solution. This taken image shows that corrosion of the plating film 300 is prevented. FIG. 10C is an image taken when an insufficient amount of protection current was supplied during soaking in the plating solution. This taken image shows that the plating film 300 is corroded. FIG. 10D is an image taken when an excess amount of protection current was supplied during soaking in the plating solution. This taken image shows that a metal deposits on the plating film 300 (additional plating). These results show that the appropriate supply of protection current to a substrate face held to wait in the plating solution prevents additional plating and also prevents corrosion of the plating film.

When the face where plating is completed first is arranged to consistently face in an identical direction in the plating module, the functions related to outputting the protection current may be omitted from the rectifier 71 or the rectifier 72 on the face-side where plating is completed later.

Second Embodiment

Figure 11:
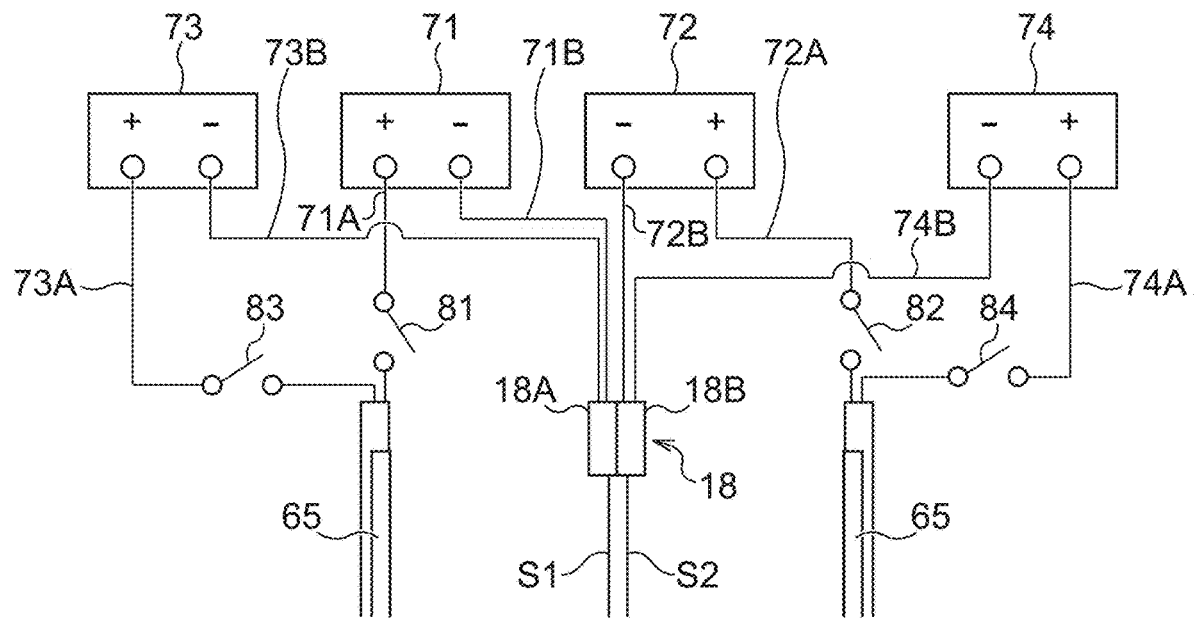
FIG. 11 is a schematic configuration diagram illustrating a connection example of rectifiers according to a second embodiment.

FIG. 11 is a schematic configuration diagram illustrating a connection example of rectifiers according to a second embodiment. According to the embodiment described above, the common rectifier 71 (or the common rectifier 72) is used to supply the film forming current and the protection current to the face S1 (or the face S2). As shown in FIG. 11, however, rectifiers 73 and 74 may be provided for supply of the protection current, separately from rectifiers 71 and 72 for supply of the film forming current. In this case, a switch 81 serving as a switching device is provided in the middle of wiring 71A between a positive electrode of the rectifier 71 and an anode 65. A switch 83 serving as a switching device is provided in the middle of wiring 73A between a positive electrode of the rectifier 73 and the anode 65. A switch 82 serving as a switching device is provided in the middle of wiring 72A between a positive electrode of the rectifier 72 and an anode 65. A switch 84 serving as a switching device is provided in the middle of wiring 74A between a positive electrode of the rectifier 74 and the anode 65. Each of the switches 81 to 84 may be a mechanical switch or may be a semiconductor switch.

When the film forming current is to be supplied to the face S1 and the face S2, the rectifiers 71 and 72 are respectively connected with the respective anodes 65 on the face S1-side and on the face S2-side by opening the switches 83 and 84 and closing the switches 81 and 82, so as to supply the film forming current from the respective anodes 65 on the face S1-side and on the face S2-side through the plating solution to the face S1 and to the face S2. When plating is completed first on the face S1, the rectifier 73 is connected with the anode 65 on the face S1-side by opening the switch 81 and closing the switch 83, so as to supply the protection current from the anode 65 on the face S1-side through the plating solution to the face S1. When plating is completed first on the face S2, the rectifier 74 is connected with the anode 65 on the face S2-side by opening the switch 82 and closing the switch 84, so as to supply the protection current from the anode 65 on the face S2-side through the plating solution to the face S2. The other configuration is similar to that of the above embodiment and is not specifically described here. When the face where plating is completed first is arranged to consistently face in an identical direction in the plating module, the rectifier 73 or the rectifier 74 for protection current on the face-side where plating is completed later and the relevant configuration (the switching device and the like) may be omitted.

According to this embodiment, the rectifiers for protection current are provided separately from the rectifiers for film forming current. This readily ensures the output control of the protection current with the high accuracy according to the use range of the protection current by using the individual rectifiers for protection current.

Third Embodiment

Figure 12:
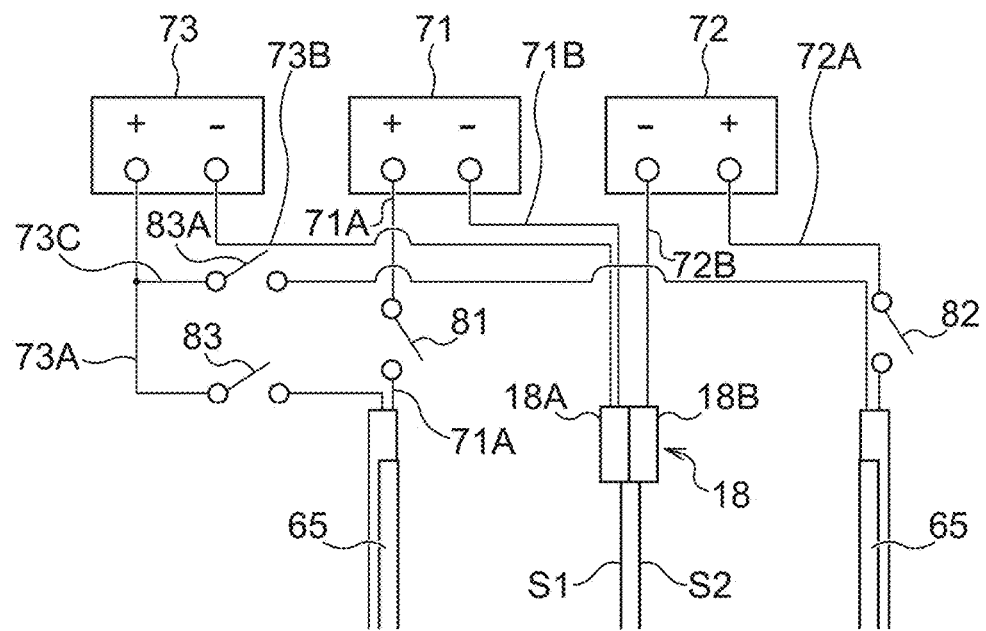
FIG. 12 is a schematic configuration diagram illustrating a connection example of rectifiers according to a third embodiment.

FIG. 12 is a schematic configuration diagram illustrating a connection example of rectifiers according to a third embodiment. This embodiment is configured to switch over the output of protection current from a single rectifier 73 (or 74) for protection current to the face S1-side or to the face S2-side. This configuration omits one of the rectifiers 73 and 74 for protection current shown in FIG. 11. FIG. 12 illustrates the configuration of switching over the output of protection current from the rectifier 73 to the face S1-side or to the face S2-side with omission of the rectifier 74. According to the embodiment, a positive electrode of the rectifier 73 is connected with the anode 65 on the face S2-side by wiring 73C, and a switch 83A serving as a switching device is provided in the middle of the wiring 73C. The switch 83A may be a mechanical switch or a semiconductor switch.

When the film forming current is to be supplied to the face S1 and the face S2, the rectifiers 71 and 72 are respectively connected with the respective anodes 65 on the face S1-side and on the face S2-side by opening the switches 83 and 83A and closing the switches 81 and 82, so as to supply the film forming current from the respective anodes 65 on the face S1-side and on the face S2-side through the plating solution to the face S1 and to the face S2. When plating is completed first on the face S1, the rectifier 73 is connected with the anode 65 on the face S1-side by opening the switch 81 and closing the switch 83 with the switch 83A kept open, so as to supply the protection current from the anode 65 on the face S1-side through the plating solution to the face S1. When plating is completed first on the face S2, the rectifier 73 is connected with the anode 65 on the face S2-side by opening the switch 82 and closing the switch 83A with the switch 83 kept open, so as to supply the protection current from the anode 65 on the face S2-side through the plating solution to the face S2.

The configuration of this embodiment enables the protection current to be supplied from the single rectifier 73 for protection current to the face where plating is completed first, irrespective of whether plating is completed first on the face S1 or on the face S2 of the substrate W. In other words, this configuration enables the protection current to be output from the single rectifier 73 for protection current to the face where plating is completed first, irrespective of which direction the face where plating is completed first is arranged in the plating module. Accordingly, this configuration enables the protection current to be output to any face without providing rectifiers for protection current with regard to the respective faces. In the case of using the separate rectifier for protection current, this configuration enables the protection current to be output to any face with reducing the number of additional components.

Other Embodiments (1) The above embodiments illustrate the configurations of outputting the protection current to the face where plating has been completed first in the process of double-sided plating. The configurations described above may, however, be applied in either of double-sided plating or single-sided plating to stir the plating solution with the paddle and output the protection current to both faces or to a single face of a substrate, thereby suppressing corrosion of the substrate face and maintaining the surface roughness and the smoothness of the plating film on the substrate, in the case where the substrate is kept in the plating solution (during a non-plating time) prior to plating or due to some device trouble (for example, a trouble in a transfer device).

(2) The above embodiments illustrate copper plating. The configurations described above may, however, be applied to other types of plating.

(3) The above embodiments illustrate double-sided plating as the example. The configurations described above may, however, be applied to single-sided plating.

At least the following aspects are provided from the embodiments described above.

According to a first aspect, there is provided a method of plating, comprising: a process of providing a substrate that includes a first face and a second face having different patterns; a plating process of respectively supplying electric current of a first plating current density and electric current of a second plating current density to the first face and to the second face of the substrate, so as to form a plating film on the first face and a plating film on the second face; and a process of, after plating is completed first either on the first face or on the second face, supplying protection current to the face where plating is completed first, wherein the protection current has a smaller current density than the first plating current density or the second plating current density of the electric current supplied to the face where plating is completed first during plating. The "pattern" herein means via holes or trenches provided to form wiring, a resist pattern provided to form bumps, rewiring, or electrode pads, an insulating film pattern or the like. The protection current is electric current flowed for the purpose of suppressing corrosion of a plating material and further metal deposition (additional plating) on a face where plating is completed first. The current value (density) of the protection current is set in such a range as to achieve this purpose and is set to a smaller current value (density) than the value of the film forming current (density). The time of completion of plating denotes the time when a film formation period of a target plating face is terminated or, in other words, the time when there is a need to stop further plating on the target plating face.

In the case of plating both faces of a substrate, the method of this aspect suppresses the face of the substrate where plating is completed first from being corroded by a plating solution before completion of plating on the other face and thereby suppresses an increase in the surface roughness on the face of the substrate. The method of this aspect suppresses corrosion of the plating material and further metal deposition on the face of the substrate where plating is completed first. This accordingly suppresses an increase in the surface roughness on the face of the substrate where plating is completed first and maintains the plating quality. Even when the time of completion of plating differs on the respective faces of the substrate, this configuration suppresses corrosion and additional plating on the target plating face of the substrate where plating is completed first and maintains the quality of the plating films.

According to a second aspect, in the method of the first aspect, a thickness of the plating film to plate the first face and a thickness of the plating film to plate the second face may be different from each other.

When plating is completed first on either of the faces due to the different thicknesses of the plating films on the respective faces, the method of this aspect suppresses the face of the substrate where plating is completed first from being corroded by the plating solution or from being additionally plated.

According to a third aspect, in the method of either the first aspect or the second aspect, the current density of the protection current may be changed according to an opening ratio of the face where plating is completed first.

The effect of suppressing corrosion and/or the effect of suppressing additional plating by the protection current is changed according to the opening ratio of the target plating face. Accordingly, plating quality is maintained more reliably by appropriately changing the magnitude of the protection current according to the opening ratio, in order to minimize or reduce the surface roughness of the plating film. This configuration supplies the more appropriate protection current according to the substrate specification and thereby minimizes or reduces the surface roughness of the plating film.

According to a fourth aspect, in the method of any one of the first aspect to the third aspect, the electric current of the first plating current density or the electric current of the second plating current density to the first face or to the second face where plating is completed first and the protection current to the first face or to the second face where plating is completed first may be supplied from a common power supply device, and a set current value of the electric current to the first face or to the second face and a set current value of the protection current with regard to the common power supply device may be corrected with different current correction factors.

The plating current supplied during plating (the film forming current) and the protection current supplied after completion of plating have significantly different set current values. In the case where the film forming current and the protection current are supplied from an identical power supply device, there is accordingly a possibility that the output current has insufficient accuracy. This is likely to cause a variation in thickness of the plating film in the course of film forming and/or an insufficiency of the protection current (the occurrence of corrosion) or an excess of the protection current (an abnormality in the thickness of the plating film and/or reduction of the uniformity caused by additional plating) in the course of protection from corrosion by the plating solution. The configuration of correcting the indicated current values with different current correction factors in respective current use ranges of the film forming current and the protection current enables desired actual current values to be output. This configuration enables the film forming current and the protection current to be output from an identical power supply device with the higher accuracy. The configuration of outputting the film forming current and the protection current from an identical power supply device does not need to separately provide a power supply device for protection current, thus saving the installation space and/or the cost.

According to a fifth aspect, in the method of any one of the first aspect to the third aspect, the electric current of the first plating current density or the electric current of the second plating current density to the first face or to the second face where plating is completed first may be supplied from a first power supply device, and the protection current to the first face or to the second face where plating is completed first may be supplied from a second power supply device.

In the method of this aspect, the individual power supply device is selectable corresponding to a current range of the film forming current and a current range of the protection current. This enables the film forming current and the protection current to be output with high accuracy.

According to a sixth aspect, in the method of the fifth aspect, a supply destination of the protection current from the second power supply device may be switched over between the first face and the second face of the substrate, according to on which of the first face and the second face plating is completed first.

In the method of this aspect, even when the face where plating is completed first is changed according to the type of the substrate or according to the process or when the direction of the substrate in the plating module is unknown or is changed, switching over the output destination of the single power supply device enables the protection current to be supplied from the single power supply device to the face where plating is completed first. This configuration does not need to provide power supply devices for protection currents with regard to respective faces, thus saving the installation space and/or the cost.

According to a seventh aspect, in the method of any one of the first aspect to the sixth aspect, the process of supplying the protection current to the face where plating is completed first may stir a plating solution with a paddle that is located to be opposed to the face where plating is completed first.

In the method of this aspect, the plating solution is convected and homogenized by stirring with the paddle. Exposing the surface of the plating film to the homogeneous plating solution maintains the smoothness of the surface of the plating film.

According to an eighth aspect, in the method of any one of the first aspect to the seventh aspect, the current density of the protection current may be equal to or smaller than 1/100 of the first plating current density or the second plating current density of the electric current supplied to the face where plating is completed first during plating.

In the method of this aspect, the protection current (density) is made equal to or smaller than 1/100 of the film forming current (density). This configuration suppresses additional deposition on the face where plating is completed first and also suppresses corrosion of the surface of the plating film.

According to a ninth aspect, there is provided an apparatus for plating, comprising: a plating module configured to perform plating with regard to a substrate; and a controller configured to control plating in the plating module. The controller is configured: to respectively supply electric current of a first plating current density and electric current of a second plating current density to a first face and to a second face of the substrate, so as to form a plating film on the first face and a plating film on the second face; and after plating is completed first either on the first face or on the second face, to supply protection current to the face where plating is completed first, wherein the protection current has a smaller current density than the first plating current density or the second plating current density of the electric current supplied to the face where plating is completed first during plating.

The configuration of this aspect has similar functions and advantageous effects to those of the first aspect.

According to a tenth aspect, in the apparatus of the ninth aspect, the controller may be configured to change the current density of the protection current according to an opening ratio of the face where plating is completed first.

The configuration of this aspect has similar functions and advantageous effects to those of the third aspect.

According to an eleventh aspect, the apparatus of either the ninth aspect or the tenth aspect may further comprise a common power supply device configured to supply the electric current of the first plating current density or the electric current of the second plating current density to the first face or to the second face where plating is completed first and to supply the protection current to the first face or to the second face where plating is completed first. The controller may correct a set current value of the electric current to the first face or to the second face and a set current value of the protection current with regard to the common power supply device, with different current correction factors.

The configuration of this aspect has similar functions and advantageous effects to those of the fourth aspect.

According to a twelfth aspect, the apparatus of either the ninth aspect or the tenth aspect may further comprise a first power supply device configured to supply the electric current of the first plating current density or the electric current of the second plating current density to the first face or to the second face where plating is completed first; and a second power supply device configured to supply the protection current to the first face or to the second face where plating is completed first.

The configuration of this aspect has similar functions and advantageous effects to those of the fifth aspect.

According to a thirteenth aspect, the apparatus of the aspect 12 may further comprise a switching device configured to switch over a supply destination of the protection current from the second power supply device between the first face and the second face of the substrate.

The configuration of this aspect has similar functions and advantageous effects to those of the sixth aspect.

According to a fourteenth aspect, there is provided a non-volatile storage medium that stores a program for activating a computer to perform a control method of an apparatus for plating. The program comprises: respectively supplying electric current of a first plating current density and electric current of a second plating current density to a first face and to a second face of a substrate, so as to form a plating film on the first face and a plating film on the second face; and after plating is completed first either on the first face or on the second face, supplying protection current to the face where plating is completed first, wherein the protection current has a smaller current density than the first plating current density or the second plating current density of the electric current supplied to the face where plating is completed first during plating.

The configuration of this aspect has similar functions and advantageous effects to those of the first aspect.

Although the embodiments of the present invention have been described based on some examples, the embodiments of the invention described above are presented to facilitate understanding of the present invention, and do not limit the present invention. The present invention can be altered and improved without departing from the subject matter of the present invention, and it is needless to say that the present invention includes equivalents thereof. In addition, it is possible to arbitrarily combine or omit respective constituent elements described in the claims and the specification in a range where at least a part of the above-mentioned problem can be solved or a range where at least a part of the effect is exhibited.

The present application claims priority to Japanese patent application No. 2019-111339 filed on Jun. 14, 2019. The entire disclosure of Japanese patent application No. 2019-111339 filed on Jun. 14, 2019, including the specification, claims, drawings and abstract is incorporated herein by reference in its entirety. The entire disclosure of Japanese Unexamined Patent Publication No. 2019-007075 (Patent Document 1) and Japanese Unexamined Patent Publication No 2016-74975 (Patent Document 2), including the specification, claims, drawings and abstract is incorporated herein by reference in its entirety.

REFERENCE SIGNS LIST

1 plating apparatus
12 cassette table
14 aligner
16 spin dryer
20 substrate loading/unloading station
22 substrate transfer device
24 stocker 26 pre-wet module
28 pre-soak module
30a first rinse module
30b second rinse module
32 blow module
34 plating module
38 plating bath
36 overflow tank
18 substrate holder
18A, 18B external connection electrodes
34 plating module
38 plating bath
61 paddle
62 paddle shaft
63 regulation plate
64 anode unit
65 anode
66 anode holder
71, 72, 73, 74 rectifiers (power supply devices)
81, 82, 83, 83a, 84 switches

The invention claimed is:

1. A method of plating, comprising:
providing a substrate that includes a first face and a second face having different patterns;
supplying electric current of a first plating current density to the first face and electric current of a second plating current density to the second face of the substrate, so as to form a plating film on the first face and a plating film on the second face; and
after plating is completed on either the first face or on the second face, supplying protection current to one of the first face or the second face where plating is completed first, wherein the protection current has a smaller current density than the first plating current density or the second plating current density of the electric current supplied during plating to the face where plating is completed first.

2. The method according to claim 1,
wherein a thickness of the plating film to plate the first face and a thickness of the plating film to plate the second face are different from each other.

3. The method according to claim 1,
wherein the current density of the protection current is changed according to an opening ratio of the face where plating is completed first.

4. The method according to claim 1,
wherein the electric current of the first plating current density or the electric current of the second plating current density to the first face or to the second face where plating is completed first and the protection current to the first face or to the second face where plating is completed first are supplied from a common power supply device, and
a set current value of the electric current to the first face or to the second face and a set current value of the protection current with regard to the common power supply device are corrected with different current correction factors.

5. The method according to claim 1,
wherein the electric current of the first plating current density or the electric current of the second plating current density to the first face or to the second face where plating is completed first is supplied from a first power supply device, and the protection current to the first face or to the second face where plating is completed first is supplied from a second power supply device.

6. The method according to claim 5,
wherein a supply destination of the protection current from the second power supply device is switched over between the first face and the second face of the substrate, according to on which of the first face and the second face plating is completed first.

7. The method according to claim 1, wherein supplying the protection current includes stirring a plating solution with a paddle that is located to be opposed to the face where plating is completed first.

8. The method according to claim 1,
wherein the current density of the protection current is equal to or smaller than 1/100 of the first plating current density or the second plating current density of the electric current supplied to the face where plating is completed first during plating.

9. An apparatus for plating, comprising:
a plating module configured to perform plating with regard to a substrate; and
a controller configured to control plating in the plating module,
wherein the controller is configured:
to supply electric current of a first plating current density to a first face and electric current of a second plating current density to a second face of the substrate, so as to form a plating film on the first face and a plating film on the second face; and
after plating is completed on either the first face or on the second face, to supply protection current to one of the first face or the second face where plating is completed first, wherein the protection current has a smaller current density than the first plating current density or the second plating current density of the electric current supplied to the face where plating is completed first during plating.

10. The apparatus according to claim 9,
wherein the controller is configured to change the current density of the protection current according to an opening ratio of the face where plating is completed first.

11. The apparatus according to claim 9, further comprising:
a common power supply device configured to supply the electric current of the first plating current density or the electric current of the second plating current density to the first face or to the second face where plating is completed first and to supply the protection current to the first face or to the second face where plating is completed first, wherein
the controller corrects a set current value of the electric current to the first face or to the second face and a set current value of the protection current with regard to the common power supply device, with different current correction factors.

12. The apparatus according to claim 9, further comprising:
a first power supply device configured to supply the electric current of the first plating current density or the electric current of the second plating current density to the first face or to the second face where plating is completed first; and
a second power supply device configured to supply the protection current to the first face or to the second face where plating is completed first.

13. The apparatus according to claim 12, further comprising:
a switching device configured to switch over a supply destination of the protection current from the second power supply device between the first face and the second face of the substrate.

14. A non-volatile storage medium that stores a program for activating a computer to perform a control method of an apparatus for plating, wherein the program comprises:

supplying electric current of a first plating current density to a first face and electric current of a second plating current density to a second face of a substrate, so as to form a plating film on the first face and a plating film on the second face; and after plating is completed on either the first face or on the second face, supplying protection current to one of the first face or the second face where plating is completed first, wherein the protection current has a smaller current density than the first plating current density or the second plating current density of the electric current supplied to the face where plating is completed first during plating.

* * * * *